United States Patent [19]

Vyne

[11] Patent Number: 4,553,106
[45] Date of Patent: Nov. 12, 1985

[54] OUTPUT STAGE FOR AN OPERATIONAL AMPLIFIER

[75] Inventor: Robert L. Vyne, Tempe, Ariz.

[73] Assignee: Motorola, Inc., Schaumburg, Ill.

[21] Appl. No.: 593,165

[22] Filed: Mar. 26, 1984

[51] Int. Cl.[4] ............................ H03F 3/30; H03F 1/30
[52] U.S. Cl. .................................... 330/272; 330/289; 330/294
[58] Field of Search ............... 330/255, 256, 266, 272, 330/289, 294, 298

[56] References Cited

U.S. PATENT DOCUMENTS 3,693,107  9/1972  Long ................................. 330/266
4,403,200  9/1983  Davis ............................. 330/307 X Primary Examiner—James B. Mullins
Attorney, Agent, or Firm—Vincent B. Ingrassia

[57] ABSTRACT

An operational amplifier includes an input stage, an output stage including first, second and third NPN output transistors, and an intermediate stage. The output stage is driven by a thermal current having a positive temperature coefficient so as to keep the gain of the output stage substantially constant over temperature. Thus, the amplifiers Miller loop stability will also remain substantially constant over temperature.

4 Claims, 1 Drawing Figure

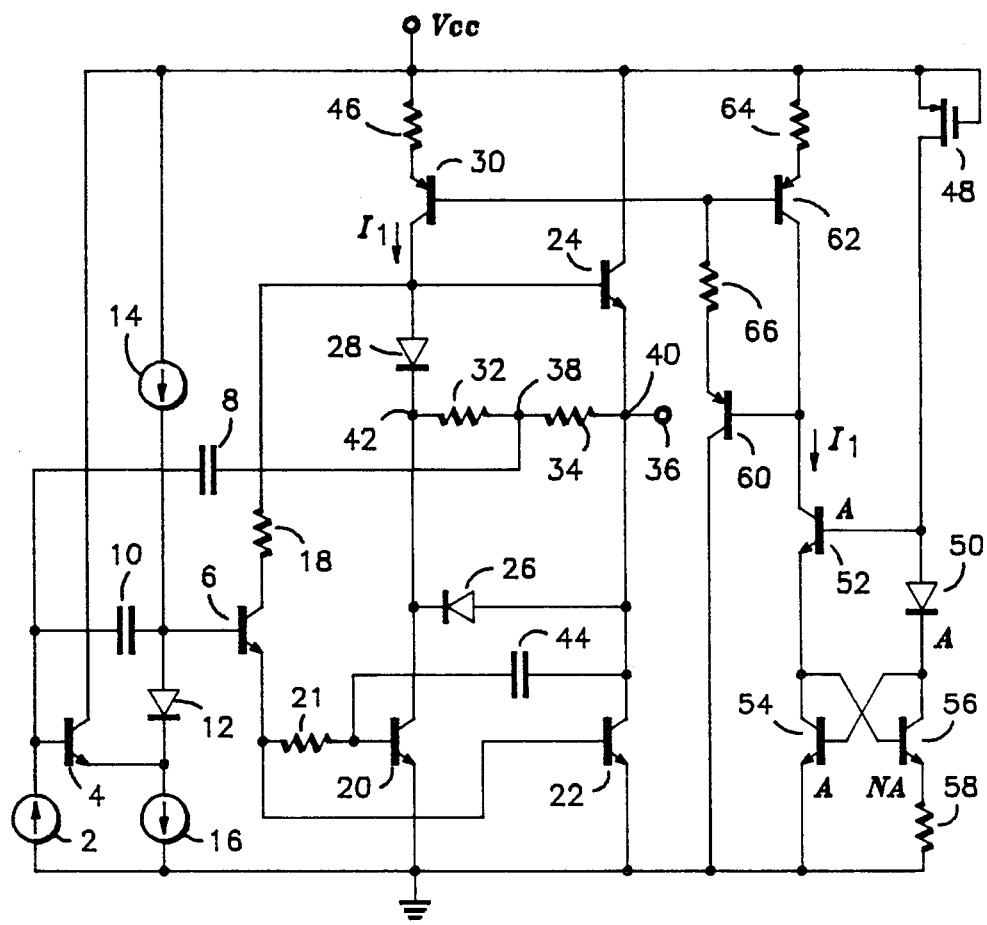

OUTPUT STAGE FOR AN OPERATIONAL AMPLIFIER

BACKGROUND OF THE INVENTION

This invention relates generally to operational amplifiers, and more particularly, to an all NPN monolithically integrable output stage for an operational amplifier which includes a thermal current source.

To achieve a higher frequency response, greater output swing, reduced output stage emitter-follower peaking and to simplify integrated circuit construction, operational amplifiers have been developed which include output stages incorporating only NPN transistors. Such an output circuit is shown and described in U.S. Pat. No. 4,403,200 entitled "Output Stage for Operational Amplifier". Unfortunately, as was the case with prior art operational amplifiers, the circuit can become unstable at low temperatures. This is true since the gain of the output Miller loop is directly proportional to the ratio of the load resistance to the dynamic emitter resistance. As the temperature drops, the dynamic emitter resistance similarly drops causing a significant increase in the gain thus rendering the amplifier unstable.

SUMMARY OF THE INVENTION

It is an object to the present invention to provide an improved operational amplifier.

It is a further object of the present invention to provide an operational amplifier having an output stage which is driven by a thermal current source to enhance the stability of the amplifier.

It is a still further object of the present invention to provide an improved operational amplifier having an output stage which is driven by a current having a positive temperature coefficient.

BRIEF DESCRIPTION OF THE DRAWING

The above and other objects, features and advantages of the present invention will be more clearly understood from the following detailed description taken in conjunction with the accompanying drawing which is a schematic diagram of the improved operational amplifier.

DESCRIPTION OF THE PREFERRED EMBODIMENT

The operational amplifier shown in the drawing inclues an input stage (for example a differential input stage of the type well known to those skilled in the art), generally represented by current source 2. Suffice it to say that if the input stage is of the differential type, one set of differential input voltages will result in current being sourced to the base of transistor 4 while another set of differential input voltages will result in base drive being diverted from the base of transistor 4 which is the input of the amplifier's second stage.

Transistor 4 has a collector coupled to a first source of supply voltage ($V_{CC}$) and an emitter coupled to the junction of the cathode of diode 12 and a first terminal of current source 16. The second terminal of current source 16 is coupled to a second source of supply voltage (in this case ground). A stabilizing capacitor 10 is coupled between the anode of diode 12 and the base of transistor 4. The anode of diode 12 is also coupled via current source 14 to $V_{CC}$. The base of transistor 6 is coupled to the junction of capacitor 10 and the anode of diode 12. The collector of transistor 6 is coupled via collector resistor 18 to the base of transistor 24, and the emitter of transistor 6 is coupled to the base electrode of transistor 22 and, via resistor 21, to the base of transistor 20. Transistors 4 and 6 are actually emitter-follower transistors and help supply the required base current loading isolation between the circuit output and the output of the input stage.

Transistors 20 and 22 each have emitters coupled to ground, and a diode 26 is coupled across their collectors; i.e. diode 26 has an anode coupled to the collector of transistor 22 and a cathode coupled to the collector of transistor 20. The collector of transistor 22 is also coupled to output terminal 36 as is the anode of diode 26 and the emitter of transistor 24. Also coupled across the collectors of transistors 20 and 22 is a series resistor pair comprising resistors 32 and 34 having a junction node 38.

A first Miller capacitor 8 is coupled between node 38 and the base of transistor 4. As node 38 is moved towards node 40 bringing more resistance into the loop, the circuit exhibits less distortion but its capability to drive capacitive loads without introducing additional excess phase shift is substantially reduced. On the other hand, as node 38 is moved towards node 42 reducing the resistance in the loop, the circuit exhibits more distortion but its capacitive load drive capability is improved.

Transistor 24 has a collector coupled to $V_{CC}$ and a base coupled to the junction of the collector of current source PNP transistor 30 and the anode of diode 28, the emitter of transistor 30 being coupled to $V_{CC}$ via resistor 46. When suffficient base drive is applied to the base terminals of transistors 20 and 22, transistors 20 and 22 will turn on and current will flow from an external load coupled to output terminal 36 through transistors 20 and 22. In fact, load current will flow approximately one-half through transistor 22 and approximately one-half through the series combination of resistors 32 and 34 and then through transistor 20 since the emitter-base junction areas are assumed to be the same. This ratio, however, could be any desired value.

The load current and the values of resistors 32 and 34 are sufficiently small so as not to render diode 26 conductive during normal load current operation. If, for example, half of the load current were two milliamperes and the combination of resistors 32 and 34 have a value of 200 ohms, the voltage drop across the resistors would be 400 millivolts, and thus the voltage at the cathode of diode 28 would be the output voltage appearing at thermal 36 minus 400 millivolts. The voltage at the base of transistor 24 would be approximately 300 millivolts higher than the output voltage at terminal 36 assuming a 700 millivolt drop across diode 28. As a result, this low base-emitter voltage will cause transistor 24 to remain off, transistor 22 will sink one half the load current, and transistor 20 will sink one-half the load current and the current being supplied by current source 30. However, as the voltage at the base terminals of transistors 20 and 22 become sufficiently lower, transistors 20 and 22 will be less conductive and transistor 24 will become more conductive. This occurs because as the current in transistors 20 and 22 is reduced, the current through resistors 32 and 34 will be reduced as will the voltage drop thereacross. If, for example, the drive current through resistors 32 and 34 fell to 100 microamperes, the voltage at the cathode of diode 28 would become equal to the output voltage minus 20 millivolts. Therefore, again assuming a 700 millivolt voltage drop across diode 28, the voltage at the base of transistor 24 would be approximately 680 millivolts higher than the output voltage. This is sufficient to cause transistor 24 to become conductive. As the voltage at the base terminals of transistors 20 and 22 again increase, transistors 20 and 22 will again turn on pulling more current through resistor pair 32 and 34. This in turn will cause a gradual reduction in the voltage at the base of transistor 24 slowly turning it off.

Diode 26 is provided to protect transistor 24 in the event that the output terminal 36 should become shorted to the positive rail ($V_{CC}$) when transistors 20 and 22 are on. Were it not for the diode 26, a very high current would flow through resistors 32 and 34 and diode 28 causing a detrimental breakdown of the base-emitter junction of transistor 24. With diode 26 connected as shown, a portion of the short circuit current is conducted through diode 26 and transistor 20 bypassing series resistors 32 and 34. The sourcing portion of the output stage inherently current limits short circuits between output terminal 36 and the negative rail or ground.

A second Miller capacitor 44 is coupled between the base terminal of transistor 20 and the collector terminal of transistor 22. The positive or pull-up loop now includes transistor 4, diode 12, transistor 6, transistor 20, diode 28, transistor 24, resistor 34 and capacitor 8. This is the loop exhibiting the highest gain, and resistor 21 in combination with capacitor 44 reduces the gain of the positive loop increasing its stability by Miller multiplication. The negative or pull-down gain path includes transistor 4, diode 12, transistor 6, transistor 20, transistor 22, resistor 34 and capacitor 8. Thus, compensation capacitor 44 only secondarily affects the gain and therefore the phase of the negative loop. Typically, capacitor 44 may have a value of 2.5 to 5 picofarads. Thus, the phase degradation of a negative loop which was present when the base terminals of transistors 20 and 22 were coupled together has been significantly reduced.

As stated previously, as temperature decreases, the dynamic emitter resistance (which is directly proportional to temperature) also decreases. Since the gain is inversely proportional to the dynamic emitter resistance, the gain will therefore increase causing the amplifier to become unstable. It has been found that by driving the amplifier's output stage with a thermal current having a positive temperature coefficient, that the gain of the output stage can be held substantially constant over temperature.

Thus thermal current ($I_1$) is generated by a current mirror circuit including field effect transistor 48, diode 50 having an emitter area A, NPN transistor 52 having an emitter area A, resistor 58, and cross-coupled NPN transistors 54 and 56 having emitter areas A and NA respectively (N being, for example, 10). The base electrodes of transistors 54 and 56 are respectively coupled to the collector electrodes of transistors 56 and 54. The emitter of transistor 54 is coupled to ground, and the emitter of transistor 56 is coupled, via resistor 58, to ground. The collector of transistor 54 is coupled to the emitter of transistor 52 which has a base coupled to the anode of diode 50 and to the source of field effect transistor 48. The cathode of diode 50 is coupled to the collector of transistor 56. Both the gate and drain electrodes of field effect transistor 48 are coupled to $V_{CC}$. The circuit also includes a turn around circuit including PNP transistors 60 and 62. The emitter of transistor 62 is coupled via resistor 64 to $V_{CC}$ while the emitter of transistor 60 is coupled via resistor 66 to the base terminals of transistors 62 and 30.

Field effect transistor 48 in conjunction with transistors 52, 54 and 56, diode 50 and resistor 58 generates, in the well known manner, a current $I_1$ which equals $$(V_T/R_{58})\ln N$$

where $$V_T = kT/Q$$

where k is Boltzman's constant, T is the absolute temperature and q is the charge and electron). Thus, $I_1$ is a thermal current having a positive temperature coefficient.

As a result of the turn-around circuit comprised of transistors 60 and 62, and resistors 64 and 66, a current $I_1$ is caused to flow in the collector of transistor 30. It should be clear that by properly scaling resistors 46 and 64, the current flowing in the collector of transistor 30 may be made to be some predetermined fraction of the current flowing in the collector of transistor 52. In any event, the current flowing in the collector of transistor 30 will also be a thermal current having a positive temperature coefficient. Therefore, as the temperature falls, the current drive in the output stage will decrease causing the dynamic emitter resistance to increase and the gain to decrease. On the other hand, as temperature increases, the current drive in the output stage will increase causing the dynamic emitter resistance to decrease and the gain to increase. This results in an amplifier having an output stage, the gain of which is relatively constant over temperature. Thus, the Miller loop stability of the amplifier will likewise be relatively constant over temperature. This permits the production of higher frequency amplifiers especially at temperatures (e.g. −55° C.) where Miller loop peaking can be excessive.

The above description is given by way of example only. Changes in form and details may be made by one skilled in the art without departing from the scope of the invention as defined by the appended claims.

I claim:

1. An operational amplifier for providing load current to an output terminal comprising:
   an input stage;
   an output stage including first, second and third NPN output transistors each having base, emitter and collector terminals, said first NPN output transistor having an emitter coupled to said output terminal for conducting load current thereto and said second and third NPN output transistors having collectors coupled to said output terminal for sinking load current therefrom;
   at least a first emitter follower transistor coupled between the output of said input stage and the base of said second PNP output transistor; and
   a current source coupled to said output stage for supplying a thermal current thereto, said thermal current having a positive temperature coefficient.

2. An operational amplifier according to claim 1 further comprising impedance means coupled between said output terminal and the collector terminal of said second NPN output terminal.

3. An operational amplifier according to claim 1 further comprising a first diode having an anode coupled to the collector of said third NPN output transistor and a cathode coupled to the collector of said second NPN output transistor for conducting short circuit current through said second NPN output transistor if said output terminal becomes shorted to a source of supply voltage.

4. An operational amplifier according to claim 1 further comprising a second diode having a cathode coupled to the collector of said second NPN output transistor and an anode for receiving said thermal current.

* * * * *